US008294182B2

(12) United States Patent
Jeong

(10) Patent No.: US 8,294,182 B2
(45) Date of Patent: Oct. 23, 2012

(54) LIGHT EMITTING DEVICE

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 83 days.

(21) Appl. No.: 12/945,283

(22) Filed: Nov. 12, 2010

(65) Prior Publication Data

US 2011/0133234 A1 Jun. 9, 2011

(30) Foreign Application Priority Data

Dec. 3, 2009 (KR) ........................ 10-2009-0118901

(51) Int. Cl.
H01L 31/072 (2006.01)
H01L 31/109 (2006.01)
H01L 31/0328 (2006.01)
H01L 31/0336 (2006.01)

(52) U.S. Cl. ... 257/199; 257/79; 257/288; 257/E21.006; 257/E21.126; 257/E21.127; 257/E21.217; 257/E21.267; 257/E21.278; 257/E21.293; 257/E21.322; 257/E21.352

(58) Field of Classification Search ............... 257/79, 257/88, 199, 200, 201, 288, 649, 759, 760, 257/774, E21.006, E21.053, E21.126, E21.127, 257/E21.267, E21.278, E21.293, E21.322, 257/E21.352

See application file for complete search history.

(56) References Cited

U.S. PATENT DOCUMENTS

| | | | | |
|---|---|---|---|---|
| 4,984,035 A * | 1/1991 | Kanzawa et al. | ............... | 257/93 |
| 6,614,055 B1 * | 9/2003 | Kusuda et al. | ................. | 257/79 |
| 2006/0060880 A1 | 3/2006 | Lee et al. | | |
| 2006/0081857 A1 | 4/2006 | Hong et al. | ..................... | 257/84 |
| 2006/0163604 A1 | 7/2006 | Shin et al. | ..................... | 257/103 |
| 2011/0260186 A1 * | 10/2011 | Jeong | .............................. | 257/98 |

FOREIGN PATENT DOCUMENTS

| | | |
|---|---|---|
| DE | 10 2005 043 649 A1 | 4/2006 |
| DE | 10 2007 057 672 A1 | 6/2009 |
| KR | 10-2006-0062715 | 6/2006 |
| KR | 10-2006-0062715 A | 6/2006 |
| KR | 10-2009-0048030 | 5/2009 |
| WO | WO 2009/069929 A2 | 6/2009 |

OTHER PUBLICATIONS

Hirsch, M.T. et al.; "Correlation of Microstructure with Electrical Behavior of Ti/GAN Schottky Contacts"; Journal of Electronic Materials; vol. 27, No. 11; Nov. 1998; pp. 1236-1239 (XP-002618542).
Chang, S.J. et al.; "Improved ESD Protection by Combining InGaN-GaN MQW LEDs with GaN Schottky Diodes"; IEEE Electron Device Letters; IEEE Service Center, New-York, NY; vol. 24, No. 3; Mar. 1, 2003, pp. 129-131 (XP-011097102).

* cited by examiner

Primary Examiner — David Nhu

(74) Attorney, Agent, or Firm — Ked & Associates, LLP

(57) ABSTRACT

A light emitting device according to the embodiment includes a first electrode; a light emitting structure including a first semiconductor layer over the first electrode, an active layer over the first semiconductor layer, and a second semiconductor layer over the second semiconductor layer; a second electrode over the second semiconductor layer; and a connection member having one end making contact with the first semiconductor layer and the other end making contact with the second semiconductor layer to form a schottky contact with respect to one of the first and second semiconductor layers.

19 Claims, 11 Drawing Sheets

LIGHT EMITTING DEVICE

The present application claims priority under 35 U.S.C. §119(a) of Korean Patent Application No. 10-2009-0118901 filed on Dec. 3, 2009, which is hereby incorporated by reference in its entirety.

BACKGROUND

The embodiment relates to a light emitting device.

A light emitting diode (LED) is a semiconductor light emitting device that converts current into light. The LED has been expensively used as a light source for a display device, a vehicle, or a lighting device. In addition, the LED can represent a white color having superior light efficiency by employing a molding member including luminescent materials or combining LEDs having various colors.

The LED is weak against the ESD (electrostatic discharge) or the surge phenomenon, so the improvement thereof is required.

SUMMARY

The embodiment provides a light emitting device having a novel structure.

The embodiment provides a light emitting device capable of preventing the ESD or surge phenomenon.

The embodiment provides a light emitting device capable of bypassing a current path when the ESD or surge phenomenon occurs.

The embodiment provides a light emitting device capable of improving the light emitting efficiency.

The embodiment provides a light emitting device capable of minimizing the defect rate while improving the reliability thereof.

A light emitting device according to the embodiment may include a first electrode; a light emitting structure including a first semiconductor layer over the first electrode, an active layer over the first semiconductor layer, and a second semiconductor layer over the active layer; a second electrode over the second semiconductor layer; and a connection member electrically connected to the second electrode and disposed between the second semiconductor layer and the first semiconductor layer while forming a schottky contact with the first semiconductor layer.

A light emitting device according to the embodiment may include a first electrode including a support member having conductivity; a light emitting structure including a first semiconductor layer, an active layer, and a second semiconductor layer over the first electrode; a second electrode over the second semiconductor layer; a connection member disposed between the first and second semiconductor layers and contacting the first and second semiconductor layers, while the connection member forms a schottky contact with one of the first and second semiconductor layers; an insulating member between a lateral side of the light emitting structure and the connection member; and a passivation layer over the lateral side of the light emitting structure.

A light emitting device according to the embodiment may include a first electrode including a support member having conductivity; a reflective layer over the first electrode; a protective layer along an outer peripheral portion of a top surface of the reflective layer; an ohmic contact layer over the top surface of the reflective layer and an inside side of the protective layer; a light emitting structure including a first semiconductor layer, an active layer, and a second semiconductor layer over the ohmic contact layer and the protective layer; a second electrode over the second semiconductor layer; a connection member electrically connected to the second electrode and disposed between the first and second semiconductor layers while forming a schottky contact with the first semiconductor layer; and an insulating member between a lateral side of the light emitting structure and the connection member.

DETAILED DESCRIPTION OF THE EMBODIMENTS

Figure 1:
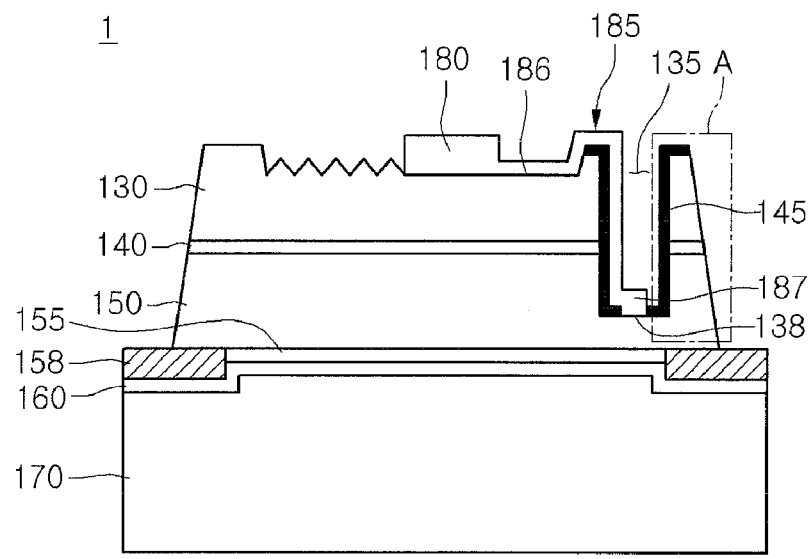
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

Figure 2:
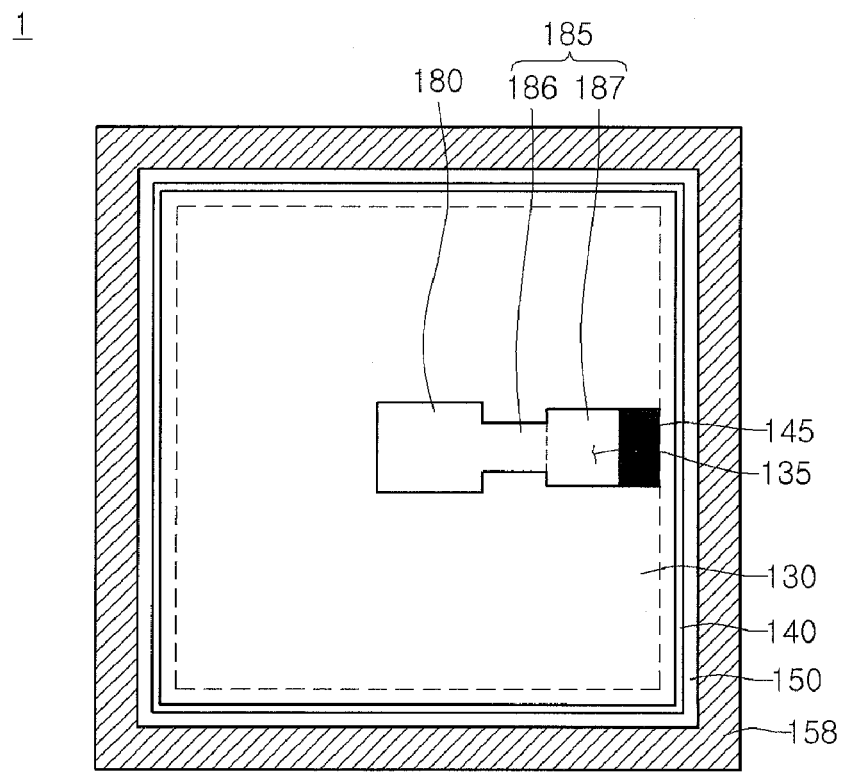
FIG. 2 is a plan view showing a light emitting device.

FIG. 1 is a sectional view showing a light emitting device according to the first embodiment, and FIG. 2 is a plan view of the light emitting device shown in FIG. 1.

Referring to FIGS. 1 and 2, the light emitting device 1 includes a first electrode 170, a reflective layer 160, a protective layer 158, an ohmic contact layer 155, a first conductive semiconductor layer 150, an active layer 140, a second conductive semiconductor layer 130, a second electrode 180, a connection member 185 and an insulating member 145. For instance, the first conductive semiconductor layer 150, the active layer 140, and the second conductive semiconductor layer 130 may include the group III-V compound semiconductor and constitute a light emitting structure.

The first electrode 170 has a function for supporting layers formed thereon as well as a function as an electrode. In other words, the first electrode 170 may include a support member having conductivity.

The first electrode 170 may include at least one selected from the group consisting of Ti, Cr, Ni, Al, Pt, Au, W, Cu and Mo or a semiconductor substrate doped with impurities, but the embodiment is not limited thereto.

The first electrode 170 can be plated and/or deposited under the light emitting structure or be attached in the form of a sheet, but the embodiment is not limited thereto.

The first electrode 170 supports the light emitting structure and supplies power, together with the second electrode 180, to the light emitting device 1.

The reflective layer 160 may be formed on the first electrode 170. The reflective layer 160 can be prepared by using at least one selected from the group consisting of Ag, Al, Pt, and an alloy thereof having the higher reflectivity, but the embodiment is not limited thereto.

The reflective layer 160 reflects light emitted from the light emitting structure, thereby improving the light extraction efficiency of the light emitting device 1.

An adhesion layer (not shown) including Ni or Ti can be formed between the reflective layer 160 and the first electrode 170 to improve an interfacial adhesive property therebetween.

The protective layer 158 can be formed along an outer peripheral portion of the light emitting structure. The protective layer 158 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO, but the embodiment is not limited thereto.

The protective layer 158 prevents the light emitting structure from making contact with the first electrode 170, thereby preventing the electric short.

The ohmic contact layer 155 may be formed on the top surface of the reflective layer 160 and an inside side of the protective layer 158. The ohmic contact layer 155 may include at least one selected from the group consisting of Ni, Pt, Ir, Rh, and Ag, but the embodiment is not limited thereto. The ohmic contact layer 155 may further include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), or GZO (gallium zinc oxide), but the embodiment is not limited thereto.

The ohmic contact layer 155 may minimize the ohmic contact resistance between the first conductive semiconductor layer 150 and the reflective layer 160. In addition, the ohmic contact layer 155 may include a pattern to improve the current spreading of the light emitting device 1.

The first conductive semiconductor layer 150 may be formed on the ohmic contact layer 155 and the protective layer 158. For instance, the first conductive semiconductor layer 150 includes a p type semiconductor layer doped with the p type dopant. The p type semiconductor layer may include a semiconductor material having the compositional formula of $In_xAl_yGa_{1-x-y}N$ ($0 \leq x \leq 1$, $0 \leq y \leq 1$, $0 \leq x+y \leq 1$), such as at least one selected from the group consisting of InAlGaN, GaN, AlGaN, InGaN, AlN, or InN. In addition, the p type semiconductor layer may be doped with p type dopant such as Mg, Zn, Ca, Sr, or Ba.

The active layer 140 can be formed on the first conductive semiconductor layer 150. The active layer 140 emits the light through the recombination of electrons (or holes) injected through the second conductive semiconductor layer 130 with holes (or electrons) injected through the first conductive semiconductor layer 150. The wavelength of the light, which determines the color of the light, may vary depending on the intrinsic material for the active layer 140. That is, the bandgap of energy band is determined according to the intrinsic material of the active layer 140 and the active layer 140 emits the light having the wavelength corresponding to bandgap difference.

The active layer 140 may have the single quantum well structure, the MQW (multiple quantum well) structure, the quantum wire structure or the quantum dot structure, but the embodiment is not limited thereto.

If the active layer 140 has the MQW structure, the active layer 140 is prepared as a stack structure including a plurality of well layers and barrier layers. For instance, the active layer 140 may have the stack structure of an InGaN well layer/a GaN barrier layer.

A clad layer (not shown) doped with the n type or p type dopant can be formed on and/or under the active layer 140. The clad layer may include an AlGaN layer or an InAlGaN layer.

The second conductive semiconductor layer 130 may be formed on the active layer 140. For instance, the second conductive semiconductor layer 130 may include an n type semiconductor layer including an n type dopant. The n type semiconductor layer may include a semiconductor material having the compositional formula of $In_xAl_yGa_{1-x-y}N$ ($0 \leq x \leq 1$, $0 \leq y \leq 1$, $0 \leq x+y \leq 1$). For instance, the n type semiconductor layer may include one selected from the group consisting of InAlGaN, GaN, AlGaN, InGaN, AlN, and InN. In addition, the n type semiconductor layer may be doped with n type dopant, such as Si, Ge or Sn.

The second conductive semiconductor layer 130 may include a p type semiconductor layer and the first conductive semiconductor layer 150 may include an n type semiconductor layer. In addition, other conductive semiconductor layers (not shown) and the active layer can be formed on the second conductive semiconductor layer 130. Thus, the light emitting device 1 may have one of NP, PN, NPN and PNP junction structures, but the embodiment is not limited thereto.

The second electrode 180 is formed on the top surface of the second conductive semiconductor layer 130. The second electrode 180, together with the first electrode 170, supplies power to the light emitting device 1. For instance, the second electrode 180 includes at least one selected from the group consisting of Al, Ti and Cr, but the embodiment is not limited thereto.

The second conductive semiconductor layer 130 is formed on the top surface thereof with a concavo-convex structure to improve the light extraction efficiency of the light emitting device 1.

The light emitting structure may include a groove 135. The groove 135 can be locally formed in the light emitting structure. The groove 135 has a predetermined size and is recessed downward of the light emitting structure in the form of a dent. When viewed from the top, the groove 135 has a triangular shape, a rectangular shape, a polygonal shape, a circular shape, or an oval shape, but the embodiment is not limited thereto. The groove 135 can be formed through the etching or laser drilling process. The groove 135 extends through the second conductive semiconductor layer 130 and the active layer 140 and the first conductive semiconductor layer 150 is partially removed by the groove 135 so that the first conductive semiconductor layer 150 is exposed through the groove 135. However, the embodiment may not limit the manufacturing method and the shape of the groove 135.

The connection member 185 may be formed along the groove 135. That is, the connection member 185 can be formed at the lateral sides of the second conductive semiconductor layer 130, the active layer 140 and the first conductive semiconductor layer 150 formed in the groove 135. One end 186 of the connection member 185 makes contact with the second conductive semiconductor layer 130 and the other end 187 of the connection member 185 makes contact with the first conductive semiconductor layer 150. One end 186 of the connection member 185 can be integrally formed with the second electrode 180, but the embodiment is not limited thereto.

The connection member 185 can be formed through at least one of the plating process and the deposition process, but the embodiment is not limited thereto.

The connection member 185 may be electrically connected to the second electrode 180 while being disposed between the second conductive semiconductor layer 130 and the first conductive semiconductor layer 150. In addition, the connection member 185 makes schottky contact with the first conductive semiconductor layer 150. In other words, the connection member 185 makes contact with the second conductive semiconductor layer 130 and the first conductive semiconductor layer 150, respectively, and forms a schottky contact with one of the second conductive semiconductor layer 130 and the first conductive semiconductor layer 150 and to form an ohmic contact with the other one of the second conductive semiconductor layer 130 and the first conductive semiconductor layer 150. According to the embodiment, the ohmic contact is formed between the connection member 185 and the second conductive semiconductor layer 130, and the schottky contact is formed between the connection member 185 and the first conductive semiconductor layer 150.

The connection member 185 may include at least one selected from the group consisting of Al, Ti and Cr to form the schottky contact with the first conductive semiconductor layer 150.

If the connection member 185 may include the above metal, one end 186 of the connection member 185 makes contact with the second conductive semiconductor layer 130 while forming the ohmic contact, and the other end 187 of the connection member 185 makes contact with the first conductive semiconductor layer 150 while forming the schottky contact.

A potential barrier may be generated at a contact interface 138 between the other end 187 of the connection member 185 and the first conductive semiconductor layer 150 because high resistance occurs at the contact interface 138 due to the schottky contact. The contact interface 138 may include a concavo-convex structure, which is formed by processing the top surface of the first conductive semiconductor layer 150 formed in the groove 135, such that high resistance can be generated by the schottky contact. That is, a high potential barrier may be generated between the connection member 185 and the first conductive semiconductor layer 150 through the schottky contact due to the concavo-convex structure.

In detail, the potential barrier higher than the operational voltage for the light emitting device 1 may be generated at the contact interface 138. Thus, the voltage higher than the potential barrier must be applied to allow current to flow through the first conductive semiconductor layer 150. For instance, the potential barrier is in the range of 4V to 6V. The potential barrier may vary depending on the design rule of the light emitting device 1 and the embodiment is not limited thereto.

Since the potential barrier is higher than the operational voltage for the light emitting device 1, if the forward voltage is applied to the light emitting device 1, the current may not flow through the contact interface 138, but flow through the light emitting structure, so that the light emitting device 1 emits the light.

In contrast, if the reverse voltage higher than the potential barrier is applied to the light emitting device 1, for example, if the voltage higher than the potential barrier is applied to the light emitting device 1 due to the ESD or the surge phenomenon, the current may flow through the contact interface 138, and then flow through the ohmic contact layer 155 and the first electrode 170 by way of the first conductive semiconductor layer 150, so that the light emitting structure can be protected from the high voltage derived from the ESD or the surge phenomenon.

The insulating member 145 may be formed between an inner wall of the groove 135 and the connection member 135. The insulating member 145 is formed at both lateral sides of the second conductive semiconductor layer 130, the active layer 140 and the first conductive semiconductor layer 150 formed in the groove 135. In addition, the insulating member 145 can be formed on a portion of the top surface of the first conductive semiconductor layer 150. The connection member 185 covers at least a portion of the insulating member 145 between one end 186 and the other end 187 of the connection member 185. That is, one end 186 of the connection member 185 makes contact with the second conductive semiconductor layer 130 while being integrally formed with the second electrode 180 and the other end 187 of the connection member 185 makes contact with the first conductive semiconductor layer 150 to cover at least a portion of the insulating member 145. The insulating member 145 prevents the connection member 185 and each layer of the light emitting structure from being subject to the electric short.

Meanwhile, as shown in FIG. 1, the insulating member 145 is formed at the inner wall of the groove 135 except for the contact interface 138, but the embodiment is not limited thereto.

For instance, the insulating member may include at least one selected from the group consisting of $SiO_2$, $Si_xO_y$, $Si_3N_4$, $Si_xN_y$, $SiO_xN_y$, $Al_2O_3$, and $TiO_2$.

Figure 10:
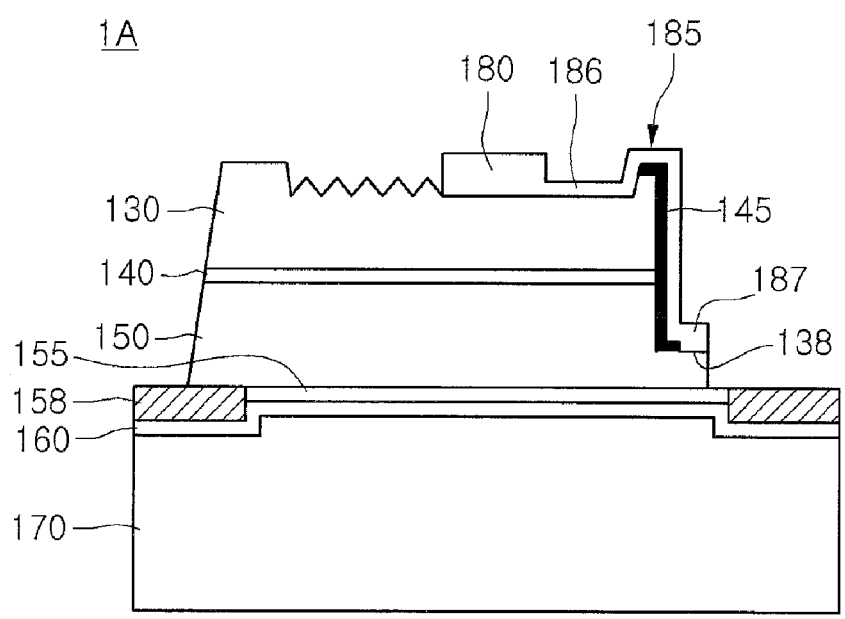
FIG. 10 is a sectional view showing a light emitting device according to another embodiment.

Referring to FIGS. 1 and 10, a first region A of the light emitting structure where the connection member 185 is not formed can be removed. Since the second conductive semiconductor layer 130 is separated and insulated by the groove 135, the first region A may not contribute for the light emission of the active layer 140, so the effect of the embodiment can be achieved even if the first region A is removed.

Hereinafter, the method of manufacturing the light emitting device according to the embodiment will be described in detail with reference to FIGS. 3 to 9. In the following description, details of the elements or structures that have been previously described will be omitted in order to avoid redundancy. In addition, it is assumed that the light emitting structure is formed under the substrate 110 to facilitate the explanation.

FIGS. 3 to 9 are sectional views showing the manufacturing procedure for the light emitting device according to the first embodiment.

Figure 3:
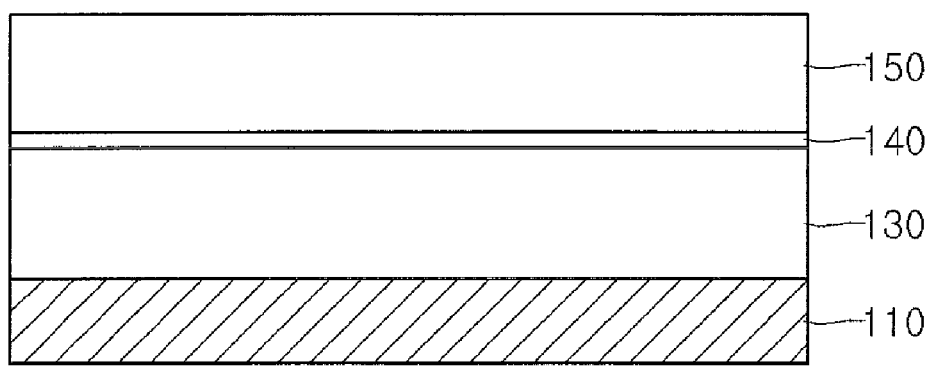
FIGS. 3 to 9 are sectional views showing the manufacturing procedure for a light emitting device according to the first embodiment.

Referring to FIG. 3, the light emitting structure is formed on the substrate 110.

That is, the second conductive semiconductor layer 130 is formed on the substrate 110, the active layer 140 is formed on the second conductive semiconductor layer 130, and the first conductive semiconductor layer 150 is formed on the active layer 140.

In addition, a non-conductive semiconductor layer including group II to VI compound semiconductors and/or a buffer layer can be formed between the second conductive semiconductor layer 130 and the substrate 110, but the embodiment is not limited thereto.

The substrate 110 may include at least one selected from the group consisting of $Al_2O_3$, SiC, Si, GaAs, GaN, ZnO, GaP, InP, and Ge.

Figure 4:
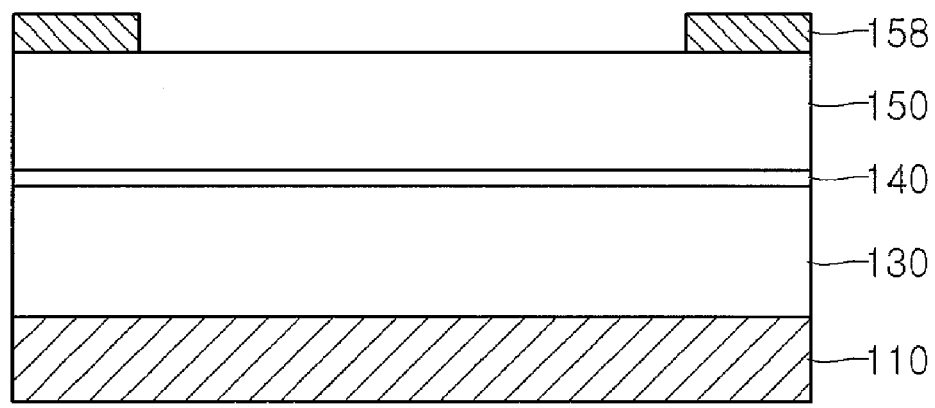

Referring to FIG. 4, the protective layer 158 is formed along an outer peripheral portion of the first conductive semiconductor layer 150. The protective layer 158 can be formed through the deposition process, but the embodiment is not limited thereto.

The protective layer 158 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

Figure 5:
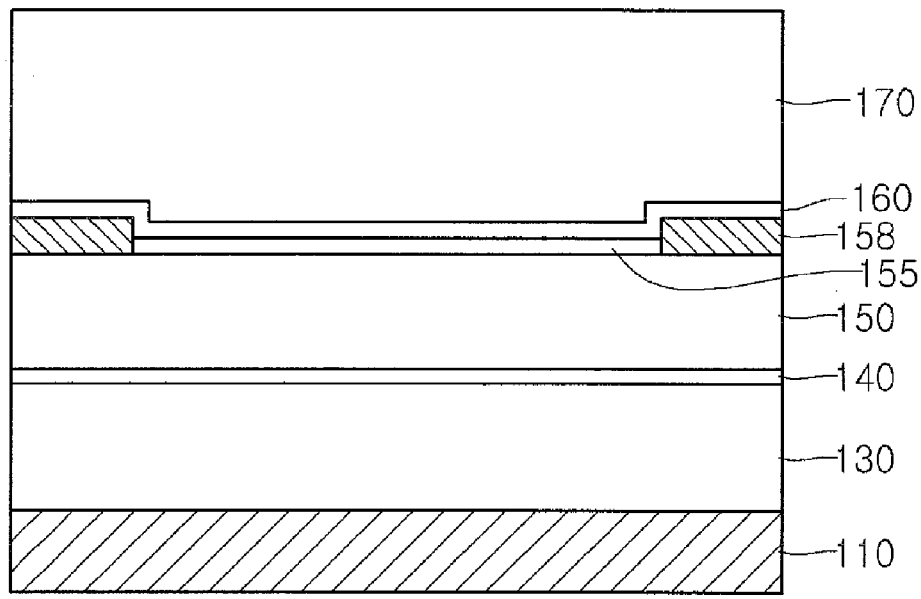

Referring to FIG. 5, the ohmic contact layer 155 is formed on the top surface of the first conductive semiconductor layer 150 and the inner portion of the protective layer 158. The reflective layer 160 is formed on the ohmic contact layer 155 and the protective layer 158. In addition, the first electrode 170 is formed on the reflective layer 160.

If the reflective layer 160 has the function of minimizing the ohmic contact resistance, the ohmic contact layer 155 may be omitted, and the embodiment is not limited thereto.

Figure 6:
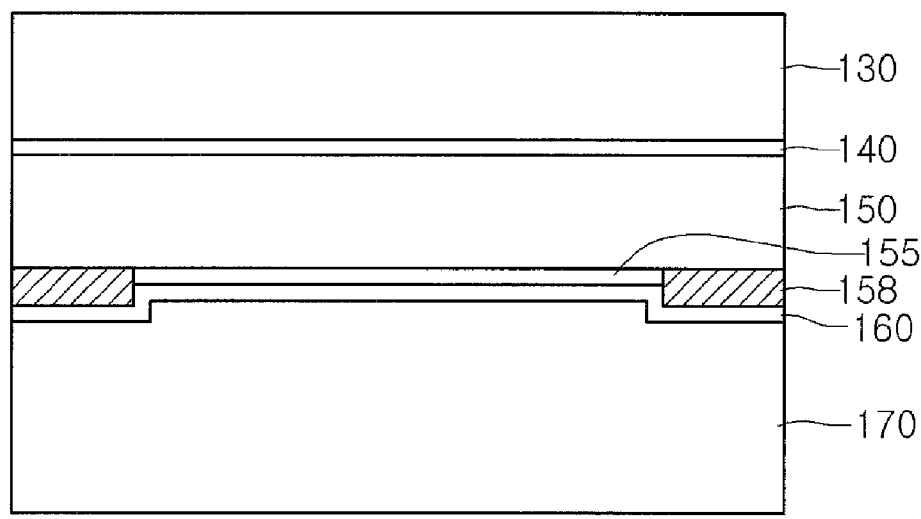

Referring to FIG. 6, the resultant structure is turned over such that the substrate 110 is disposed at the uppermost layer and the substrate 110 is removed from the second conductive semiconductor 130.

The substrate 110 can be removed through the LLO (laser lift off) scheme and/or the etching scheme, but the embodiment is not limited thereto.

After the substrate 110 has been removed, the surface of the second conductive semiconductor layer 130 is partially removed through the etching process, or the buffer layer (not shown) and/or the non-conductive semiconductor layer (not show) is removed from the first conductive semiconductor layer 150, but the embodiment is not limited thereto.

Figure 7:
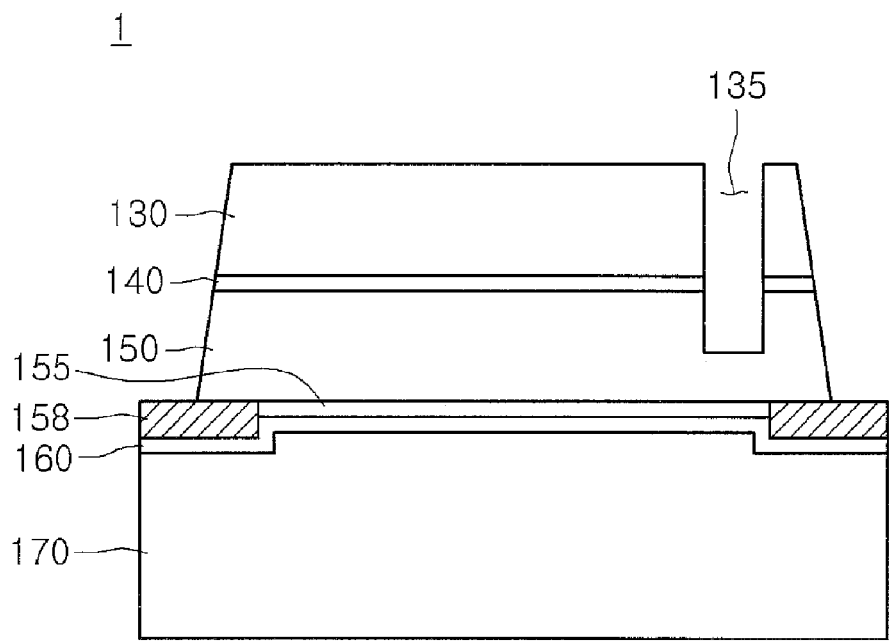

Referring to FIG. 7, the light emitting structure is subject to the mesa etching process, so that the mesa structure is formed at the lateral side of the light emitting structure.

Then, the etching process and/or the laser process is performed to form the groove 135 through the second conductive semiconductor layer 130 and the active layer 140 such that the first conductive semiconductor layer 150 can be exposed, but the embodiment is not limited thereto.

Figure 8:
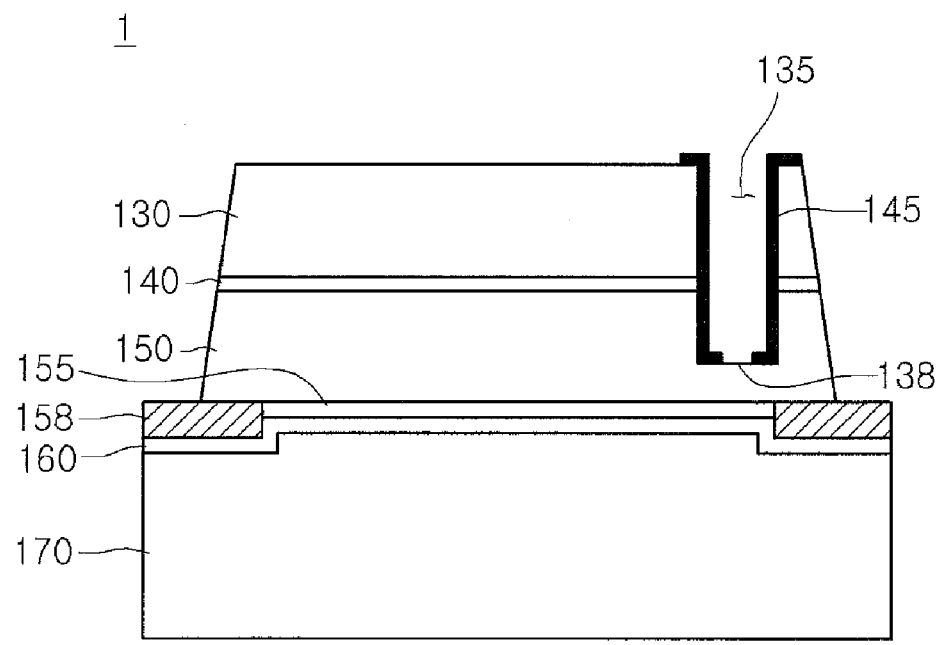

Referring to FIG. 8, the insulating member 145 is formed at the inner wall of the groove 135 except for the contact interface 138. The insulating member 145 insulates the light emitting structure from the connection member 185 which will be formed in the subsequent process. The insulating member 145 is formed at both lateral sides of the second conductive semiconductor layer 130, the active layer 140 and the first conductive semiconductor layer 150 in the groove 135. In addition, the insulating member 145 is formed on a portion of the top surface of the first conductive semiconductor layer 150. Further, the insulating member 145 is formed on a portion of the second conductive semiconductor layer 130 in the vicinity of the groove 135.

The insulating member 145 can be formed through the deposition process, but the embodiment is not limited thereto.

The insulating member 145 may include at least one selected from the group consisting of $SiO_2$, $Si_xO_y$, $Si_3N_4$, $Si_xN_y$, $SiO_xN_y$, $Al_2O_3$, and $TiO_2$.

Figure 9:
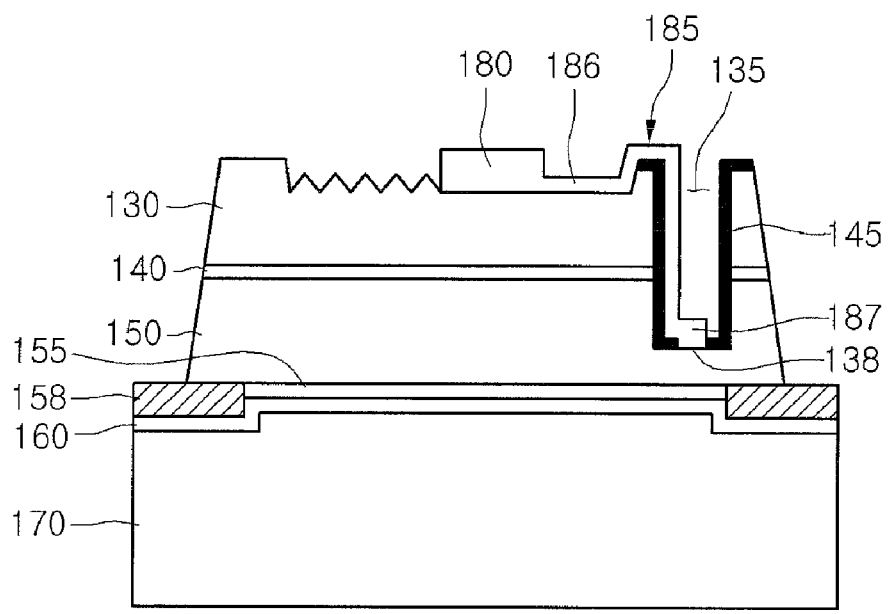

Referring to FIG. 9, the second electrode 180 is formed on the second conductive semiconductor layer 130. In addition, the connection member 185 is formed along the groove 135. One end 186 of the connection member 185 makes contact with the second conductive semiconductor layer 130 and the other end 187 of the connection member 185 makes contact with the first conductive semiconductor layer 150 through the contact interface 138. The connection member 185 can be integrally formed with the second electrode 180.

The connection member 185 can be formed through at least one of the plating process and the deposition process, but the embodiment is not limited thereto.

The connection member 185 makes contact with the second conductive semiconductor layer 130 and the first conductive semiconductor layer 150 to form a schottky contact with respect to one of the second conductive semiconductor layer 130 and the first conductive semiconductor layer 150 and to form an ohmic contact with respect to the other of the second conductive semiconductor layer 130 and the first conductive semiconductor layer 150. The connection member 185 may include at least one selected from the group consisting of Al, Ti and Cr, but the embodiment is not limited thereto.

In detail, the potential barrier higher than the operational voltage for the light emitting device 1 may be generated at the contact interface 138. Thus, the voltage higher than the potential barrier must be applied to allow current to flow through the first conductive semiconductor layer 150. For instance, the potential barrier is in the range of 4V to 6V. The potential barrier may vary depending on the design rule of the light emitting device 1 and the embodiment is not limited thereto.

Since the potential barrier is higher than the operational voltage for the light emitting device 1, if the forward voltage is applied to the light emitting device 1, the current may not flow through the contact interface 138, but flow through the light emitting structure, so that the light emitting device 1 emits the light.

In contrast, if the reverse voltage higher than the potential barrier is applied to the light emitting device 1, for example, if the voltage higher than the potential barrier is applied to the light emitting device 1 due to the ESD or the surge phenomenon, the current may flow through the contact interface 138, and then flow through the ohmic contact layer 155 and the first electrode 170 by way of the first conductive semiconductor layer 150, so that the light emitting structure can be protected from the high voltage derived from the ESD or the surge phenomenon.

The second conductive semiconductor layer 130 is formed on the top surface thereof with the concavo-convex structure to improve the light extraction efficiency of the light emitting device 1.

Hereinafter, a light emitting device and a method of manufacturing the light emitting device according to the second embodiment will be described. In the following description of the second embodiment, details of the elements or structures that have been previously described in the first embodiment will be omitted in order to avoid redundancy.

The light emitting device 2 according to the second embodiment is identical to the light emitting device 1 according to the first embodiment, except that the second electrode 180 is spaced apart from the connection member 185.

Figure 11:
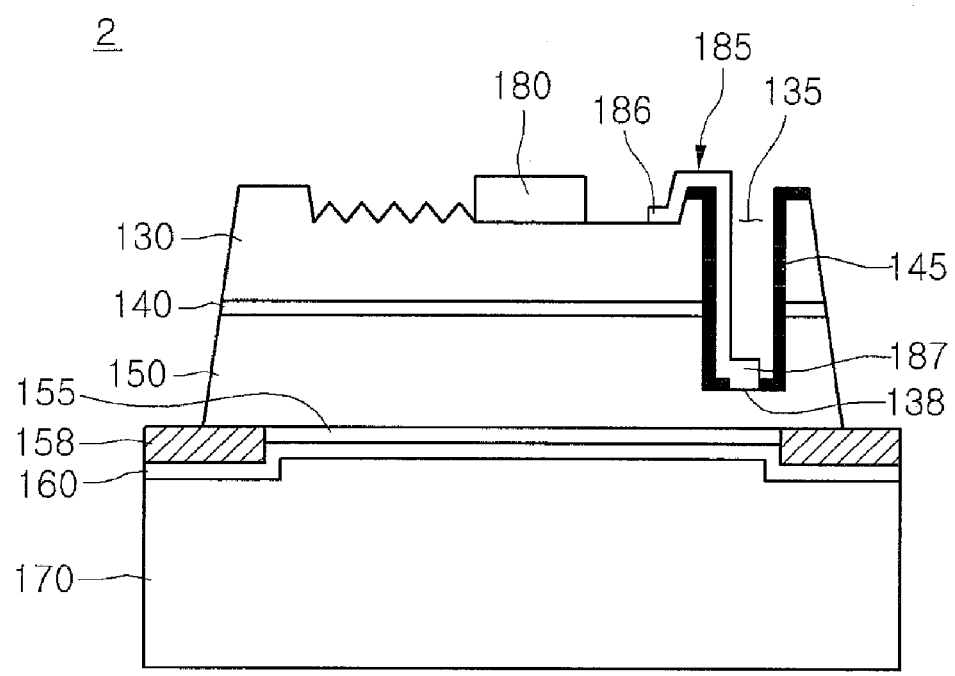
FIG. 11 is a sectional view showing a light emitting device according to the second embodiment.

FIG. 11 is a view showing the light emitting device according to the second embodiment.

Referring to FIG. 11, the light emitting device 2 includes a first electrode 170, a reflective layer 160, a protective layer 158, an ohmic contact layer 155, a first conductive semiconductor layer 150, an active layer 140, a second conductive semiconductor layer 130, a second electrode 180, a connection member 185 and an insulating member 145.

The second electrode 180 can be formed on the second conductive semiconductor layer 130.

The connection member 185 is formed along the groove 135. One end 186 of the connection member 185 makes contact with the second conductive semiconductor layer 130 and the other end 187 of the connection member 185 makes contact with the first conductive semiconductor layer 150.

The second electrode 180 is spaced apart from one end 186 of the connection member 185. In addition, the second electrode 180 is electrically insulated from one end 186 of the connection member 185. Although the second electrode 180 is spaced apart from the connection member 185, since the second conductive semiconductor layer 130 has conductivity, the connection member 185 can protect the light emitting device 2 from the ESD or the surge phenomenon. In detail, when the high voltage derived from the ESD or the surge phenomenon is applied to the second electrode 180, since the second conductive semiconductor layer 130 has conductivity, a current path is formed among the second electrode 180, the second conductive semiconductor layer 130, the connection member 185, the first conductive semiconductor layer 150, the ohmic contact layer 155, the reflective layer 160 and the first electrode 170, so that the light emitting structure can be prevented from being broken by the high reverse voltage derived from the ESD or the surge phenomenon. If the current path is not formed, the light emitting structure may be broken due to the high reverse voltage derived from the ESD or the surge phenomenon.

Hereinafter, a light emitting device and a method of manufacturing the light emitting device according to the third embodiment will be described. In the following description of the third embodiment, details of the elements or structures that have been previously described in the first embodiment will be omitted in order to avoid redundancy.

The light emitting device according to the third embodiment is identical to the light emitting device according to the first embodiment except that the connection member is formed along the outer peripheral portion of the light emitting structure.

Figure 12:
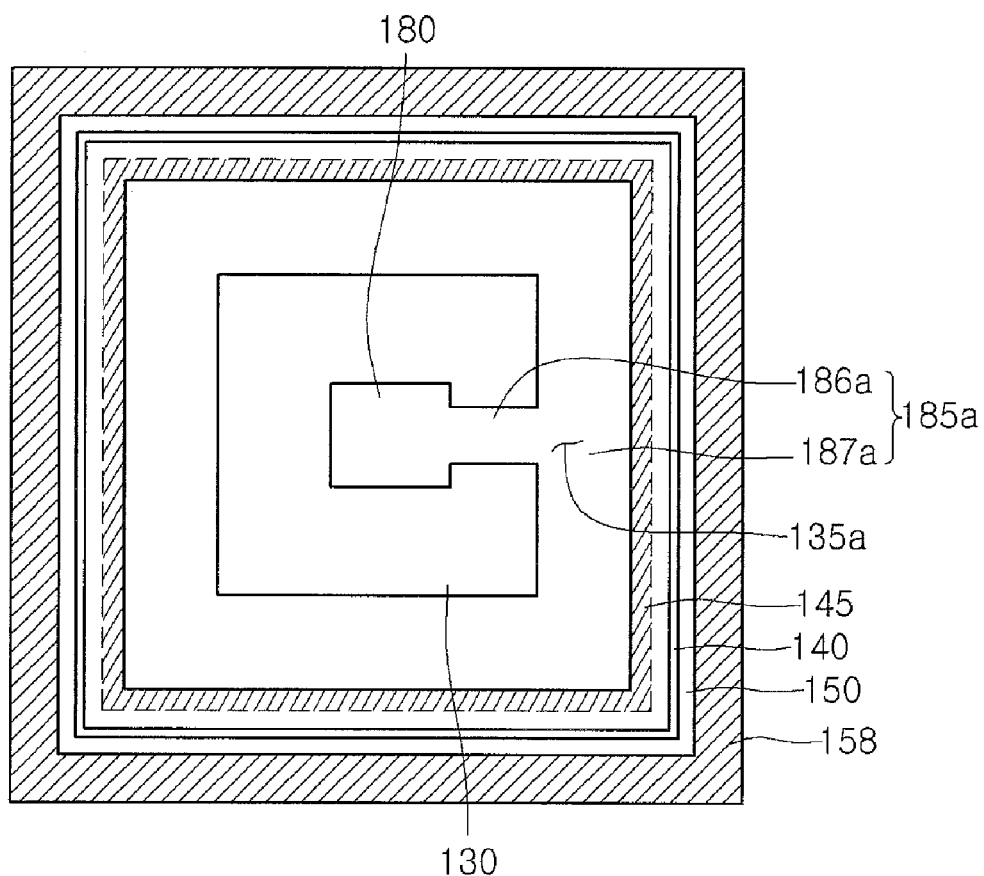
FIG. 12 is a sectional view showing a light emitting device according to the third embodiment.

FIG. 12 is a sectional view showing the light emitting device according to the third embodiment.

Referring to FIG. 12, the light emitting device 3 includes a first electrode (not shown), a reflective layer (not shown), a protective layer 158, an ohmic contact layer (not shown), a first conductive semiconductor layer 150, an active layer 140, a second conductive semiconductor layer 130, a second electrode 180, a connection member 185*a* and an insulating member 145*a*. The first conductive semiconductor layer 150, the active layer 140, and the second conductive semiconductor layer 130 may constitute a light emitting structure.

A groove 135*a* is formed along an outer peripheral portion of the light emitting structure. The groove 135*a* has the depth and shape identical to those of the groove 135 according to the first embodiment, but the embodiment is not limited thereto.

The groove 135*a* can be formed through the etching or laser drilling process. The groove 135*a* extends through the second conductive semiconductor layer 130 and the active layer 140 and the first conductive semiconductor layer 150 is partially removed by the groove 135*a* so that the first conductive semiconductor layer 150 is exposed through the groove 135*a*.

A contact interface can be formed between the exposed first conductive semiconductor layer 150 and the connection member 185*a*. In detail, the contact interface is formed along the outer peripheral portion of the light emitting structure. The contact interface may have the concavo-convex structure, which is formed by processing the top surface of the first conductive semiconductor layer 150 using oxygen or nitrogen plasma, but the embodiment is not limited thereto.

The connection member 185*a* can be formed along the groove 135 in such a manner that one end 186*a* of the connection member 185*a* makes contact with the second conductive semiconductor layer 130 and the other end 187*a* of the connection member 185*a* makes contact with the first conductive semiconductor layer 150 through the contact interface. The contact interface, which makes contact with the other end 187*a* of the connection member 185*a*, is formed along the groove 135*a* so that the contact interface may have an area as large as possible. Thus, when the high reverse voltage is applied due to the ESD or the surge phenomenon, the current path is distributed so that the ESD or the surge phenomenon can be rapidly blocked. Thus, the breakage of the light emitting structure caused by the ESD or the surge phenomenon can be minimized.

Hereinafter, a light emitting device and a method of manufacturing the light emitting device according to the fourth embodiment will be described. In the following description of the fourth embodiment, details of the elements or structures that have been previously described in the first embodiment will be omitted in order to avoid redundancy.

The light emitting device 4 according to the fourth embodiment is identical to the light emitting device 1 according to the first embodiment except that a current blocking layer 153 is formed between the ohmic contact layer 155 and the first conductive semiconductor layer 150.

Figure 13:
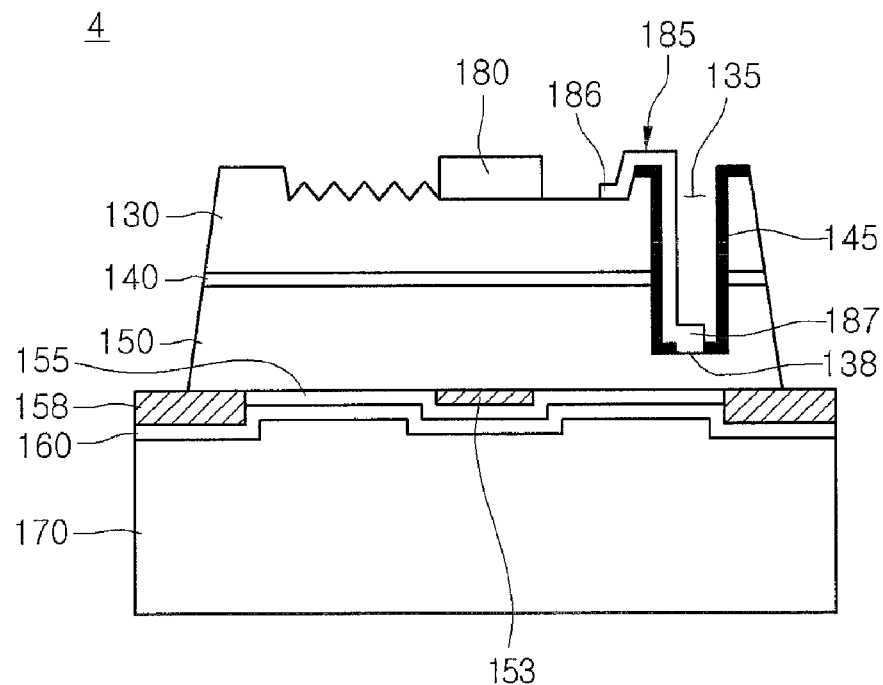
FIG. 13 is a sectional view showing a light emitting device according to the fourth embodiment.

FIG. 13 is a sectional view showing the light emitting device 4 according to the fourth embodiment.

Referring to FIG. 13, the light emitting device 4 includes a first electrode 170, a reflective layer 160, a protective layer 158, an ohmic contact layer 155, a current blocking layer 153, a first conductive semiconductor layer 150, an active layer 140, a second conductive semiconductor layer 130, a second electrode 180, a connection member 185 and an insulating member 145.

The current blocking layer 153 is formed between the ohmic contact layer 155 and the second conductive semiconductor layer 130. At least a portion of the current blocking layer 153 may overlap with the second electrode 180 in the vertical direction.

Therefore, the current blocking layer 153 prevents the current from being concentrated within the shortest distance between the first and second electrodes 170 and 180, thereby improving the light emitting efficiency of the light emitting device 4. Since the current blocking layer 153 interferes with the current flow, the current may not flow through the current blocking layer 153. Thus, the current vertically flowing between the first and second electrodes 170 and 180 may interfere with the current blocking layer 153, so that the current is distributed into the ohmic contact layer 155 adjacent to the current blocking layer 153.

The current blocking layer 153 includes a material having the electric insulating property or forming the schottky contact with respect to the first conductive semiconductor layer 150, but the embodiment is not limited thereto. For instance, the current blocking layer 153 may include at least one selected from the group consisting of ZnO, $SiO_2$, $SiO_x$, $SiO_xN_y$, $Si_3N_4$, $Al_2O_3$, $TiO_x$, Ti, Al, and Cr, but the embodiment is not limited thereto.

Hereinafter, a light emitting device and a method of manufacturing the light emitting device according to the fifth embodiment will be described. In the following description of the fifth embodiment, details of the elements or structures that have been previously described in the first embodiment will be omitted in order to avoid redundancy.

The light emitting device 5 according to the fifth embodiment is identical to the light emitting device 1 according to the first embodiment except that a passivation layer 190 is formed on at least one side of the light emitting structure that emits the light.

Figure 14:
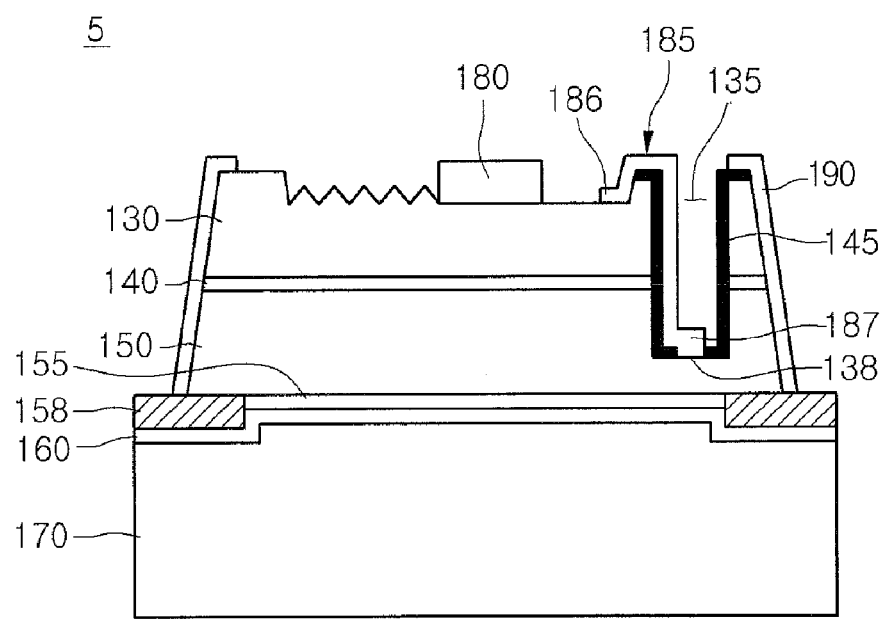
FIG. 14 is a sectional view showing a light emitting device according to the fifth embodiment.

FIG. 14 is a sectional view showing the light emitting device according to the fifth embodiment.

Referring to FIG. 14, the light emitting device 5 includes a first electrode 170, a reflective layer 160, a protective layer 158, an ohmic contact layer 155, a first conductive semiconductor layer 150, an active layer 140, a second conductive semiconductor layer 130, a second electrode 180, a connection member 185, an insulating member 145, and a passivation layer 190.

The first conductive semiconductor layer 130, the active layer 140 and the second conductive semiconductor layer 150 may constitute the light emitting structure including group III to V compound semiconductor materials that emit the light.

The passivation layer 190 can be formed on at least a side of the light emitting structure. In detail, one end of the passivation layer 190 is formed on the top surface of the light emitting structure, that is, on the insulating member 145. In addition, the other end of the passivation layer 190 extends onto the protective layer 158 along the lateral side of the light emitting structure.

The passivation layer 190 may prevent the electric short from occurring between the light emitting structure and the external electrode, thereby minimizing the defect rate of the light emitting device 5 and improving the reliability of the light emitting device 5.

For instance, the passivation layer 190 includes at least one selected from the group consisting of ZnO, $SiO_2$, $SiO_x$, $SiO_xN_y$, $Si_3N_4$, $Al_2O_3$, and $TiO_x$. The passivation layer 190 can be prepared as an oxide layer by thermo-chemically oxidizing the light emitting structure, but the embodiment is not limited thereto.

Figure 15:
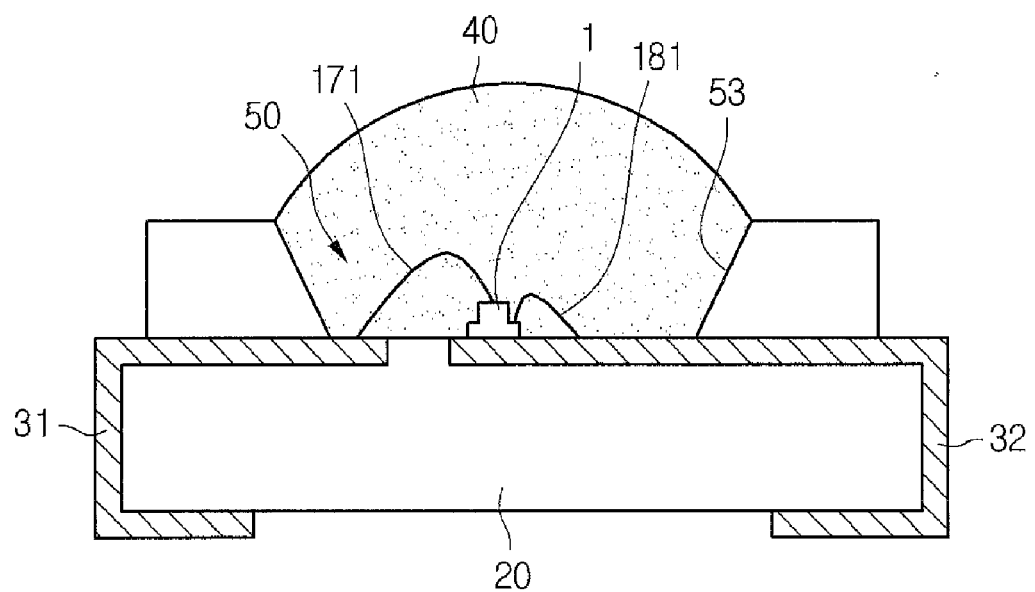
FIG. 15 is a sectional view showing a light emitting device package including a light emitting device according to the embodiment.

FIG. 15 is a sectional view showing a light emitting device package including the light emitting device according to the embodiments.

Referring to FIG. 15, the light emitting device package 30 includes a body 20, first and second electrode layers 31 and 32 formed on the body 20, the light emitting device 1 provided on the body 20 and electrically connected to the first and second electrode layers 31 and 32 and a molding member 40 that surrounds the light emitting device 1.

The body 20 may include silicon, synthetic resin or metallic material. When viewed from the top, the body 20 has a cavity 50 formed with an inclined inner wall 53.

The first and second electrode layers 31 and 32 are electrically isolated from each other and formed by passing through the body 20. In detail, one ends of the first and second electrode layers 31 and 32 are disposed in the cavity 50 and the other ends of the first and second electrode layers 31 and 32 are attached to an outer surface of the body 20 and exposed to the outside.

The first and second electrode layers 31 and 32 supply power to the light emitting device and improve the light efficiency by reflecting the light emitted from the light emitting device 1. Further, the first and second electrode layers 31 and 32 dissipate heat generated from the light emitting device 1 to the outside.

The light emitting device 1 can be installed on the body 20 or the first or second electrode layer 31 or 32.

First and second wires 171 and 181 of the light emitting device 1 can be electrically connected to one of the first and second electrode layers 31 and 32, but the embodiment is not limited thereto.

The molding member 40 surrounds the light emitting device 1 to protect the light emitting device 1. In addition, the molding member 40 may include luminescent materials to change the wavelength of the light emitted from the light emitting device 1.

Figure 16:
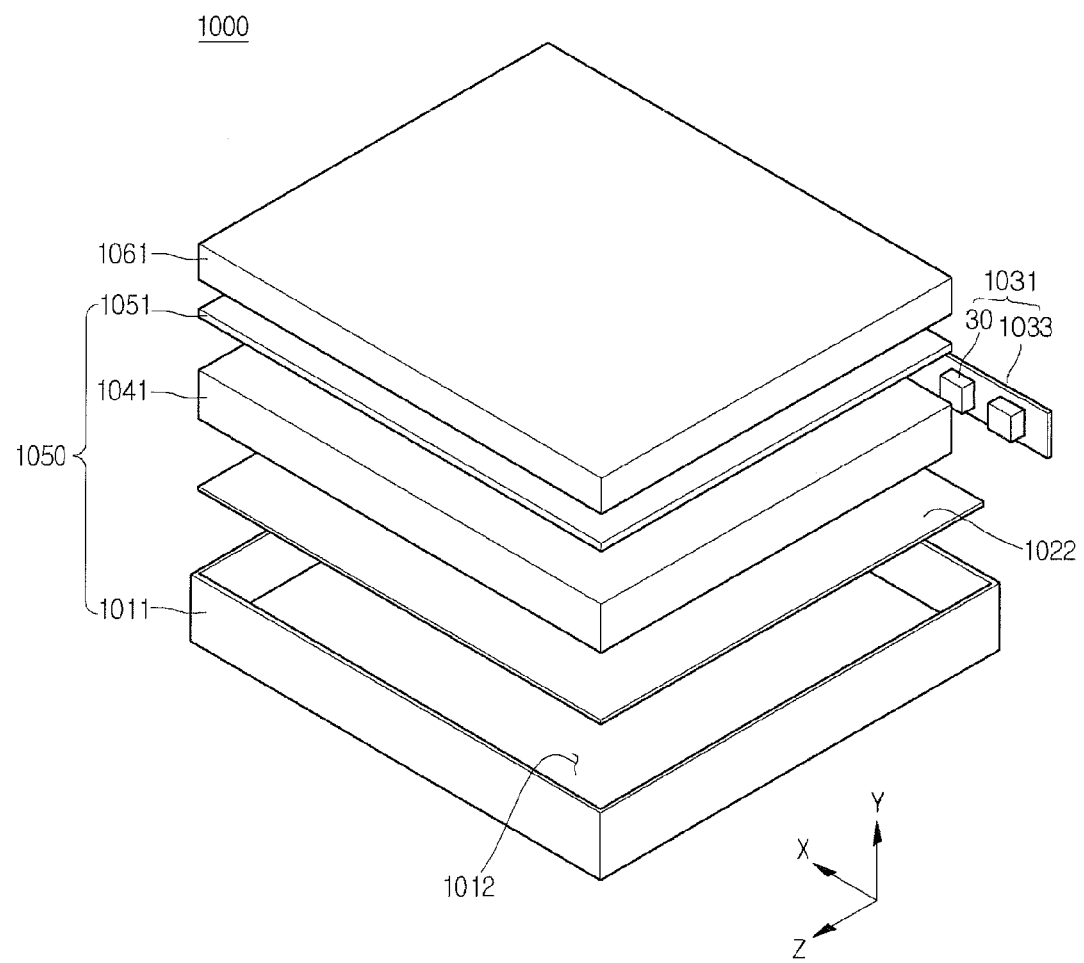
FIG. 16 is an exploded perspective view of a display device according to the embodiment.
Figure 17:
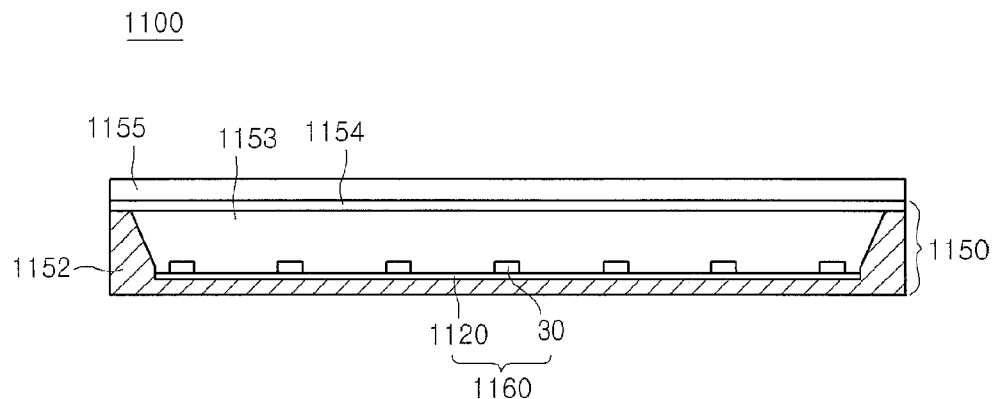
FIG. 17 is a sectional view showing a display device according to the embodiment.
Figure 18:
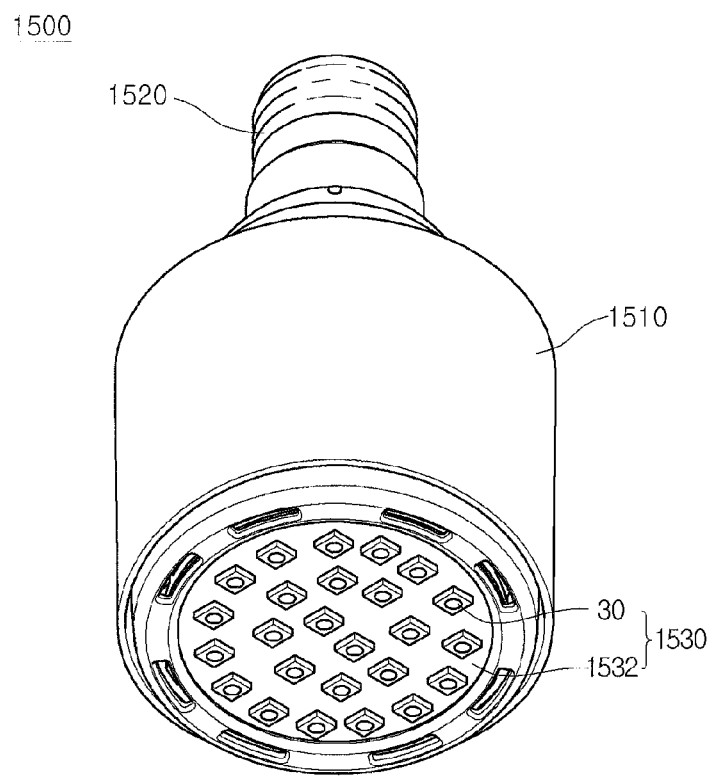
FIG. 18 is a perspective view showing a lighting device according to the embodiment.

The light emitting device or the light emitting device package according to the embodiment can be applied to the light unit. The light unit includes a plurality of light emitting devices or a plurality of light emitting device packages. The light unit may include the display device as shown in FIGS. 16 and 17 and the lighting device as shown in FIG. 18. In addition, the light unit may include a lighting lamp, a signal lamp, a headlight of a vehicle, and an electric signboard.

FIG. 16 is an exploded perspective view showing the display device according to the embodiment.

Referring to FIG. 16, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 17 is a sectional view showing a display device according to the embodiment.

Referring to FIG. 17, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit (not shown).

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 18 is a perspective view showing a lighting device according to the embodiment.

Referring to FIG. 18, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the light emitting structure includes the first conductive semiconductor layer, the active layer and the second conductive semiconductor layer. In addition, one end of the connection member makes contact with the first conductive semiconductor layer and the other end of the connection member makes contact with the second conductive semiconductor layer to form the schottky contact with respect to one of the first and second conductive semiconductor layer. Thus, when the high reverse voltage derived from the ESD or the surge phenomenon is applied to the light emitting structure, the current path is formed through the first or second conductive semiconductor layer which forms the schottky contact with respect to the connection member, so that the light emitting structure can be prevented from being broken by the high reverse voltage.

According to the embodiment, the light emitting structure includes the groove, which extends through the second conductive semiconductor layer and the active layer to expose the first conductive semiconductor layer, and the groove has the dent shape. In addition, the first or second conductive semiconductor layer, which forms the schottky contact with respect to the connection member, can be formed on the surface thereof with the contact interface having the concavo-convex structure. Therefore, the connection member is disposed between the first and second conductive semiconductor layers and the contact interface is formed on the surface of the first or second conductive semiconductor layer, so that the current path, which bypasses at least the active layer, is formed when the high reverse voltage derived from the ESD or the surge phenomenon is applied to the light emitting structure, thereby preventing the light emitting structure from being broken by the ESD or the surge phenomenon.

According to the embodiment, the groove is formed along the outer peripheral portion of the light emitting structure, and the first or second conductive semiconductor layer, which forms the schottky contact with respect to the connection member, is formed on the surface thereof with the contact interface having the concavo-convex structure. Thus, the area of the contact interface can be maximized, so that the current path is distributed when the high reverse voltage derived from the ESD or the surge phenomenon is applied to the light emitting structure, thereby rapidly blocking the ESD or the surge phenomenon.

According to the embodiment, one end of the connection member is integrally formed with the second electrode. Thus, the high reverse voltage supplied to the second electrode caused by the ESD or the surge phenomenon is bypassed to the conductive semiconductor layer, which forms the schottky contact with respect to the connection member, so that the light emitting structure can be protected from the ESD or the surge phenomenon.

The method of manufacturing the light emitting device according to the embodiment includes the steps of preparing the first electrode, forming the light emitting structure including the first conductive semiconductor layer, the active layer, and the second conductive semiconductor layer on the first electrode, forming the second electrode on the second conductive semiconductor layer, and preparing the connection member having one end making contact with the first conductive semiconductor layer and the other end making contact with the second conductive semiconductor layer, in which the connection member forms the schottky contact with respect to one of the first and second conductive semiconductor layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a first electrode;
   a light emitting structure including a first semiconductor layer over the first electrode, an active layer over the first semiconductor layer, and a second semiconductor layer over the active layer;
   a second electrode over the second semiconductor layer; and
   a connection member electrically connected to the second electrode and disposed between the second semiconductor layer and the first semiconductor layer while forming a schottky contact with the first semiconductor layer.

2. The light emitting device of claim 1, wherein the light emitting structure includes a groove, which extends through the second semiconductor layer and the active layer to expose the first semiconductor layer.

3. The light emitting device of claim 2, wherein the groove is locally formed in the light emitting structure and has a dent shape.

4. The light emitting device of claim 2, wherein the groove is formed along an outer peripheral portion of the light emitting structure.

5. The light emitting device of claim 4, wherein the groove has a dent shape.

6. The light emitting device of claim 1, wherein the connection member is integrally formed with the second electrode.

7. The light emitting device of claim 2, further comprising an insulating member between the light emitting structure and the connection member at a lateral side of the groove.

8. The light emitting device of claim 7, wherein the insulating member is disposed at lateral sides of the second semiconductor layer, the active layer, and the first semiconductor layer, respectively.

9. The light emitting device of claim 1, wherein the first semiconductor layer includes a contact interface having a concavo-convex structure on a surface thereof.

10. The light emitting device of claim 9, wherein the contact interface has a potential barrier higher than operational voltage of the light emitting structure.

11. The light emitting device of claim 1, wherein the connection member is spaced apart from the second electrode.

12. The light emitting device of claim 1, further comprising an ohmic contact layer between the first electrode and the first semiconductor layer.

13. The light emitting device of claim 12, further comprising a reflective layer between the first electrode and the ohmic contact layer.

14. The light emitting device of claim 12, further comprising a current blocking layer between the ohmic contact layer and the first semiconductor layer.

15. The light emitting device of claim 14, wherein at least a portion of the current blocking layer is overlapped with the second electrode in a vertical direction.

16. The light emitting device of claim 1, further comprising a passivation layer on at least one side of the light emitting structure.

17. The light emitting device of claim 1, wherein the first electrode includes a support member having conductivity.

18. A light emitting device, comprising:
   a first electrode including a support member having conductivity;
   a light emitting structure including a first semiconductor layer, an active layer, and a second semiconductor layer over the first electrode;
   a second electrode over the second semiconductor layer;

a connection member disposed between the first and second semiconductor layers and contacting the first and second semiconductor layers, wherein the connection member forms a schottky contact with one of the first and second semiconductor layers;

an insulating member between a lateral side of the light emitting structure and the connection member; and a passivation layer over the lateral side of the light emitting structure.

19. A light emitting device, comprising:

a first electrode including a support member having conductivity;

a reflective layer over the first electrode;

a protective layer along an outer peripheral portion of a top surface of the reflective layer;

an ohmic contact layer over the top surface of the reflective layer and an inside side of the protective layer;

a light emitting structure including a first semiconductor layer, an active layer, and a second semiconductor layer over the ohmic contact layer and the protective layer;

a second electrode over the second semiconductor layer;

a connection member electrically connected to the second electrode and disposed between the first and second semiconductor layers while forming a schottky contact with the first semiconductor layer; and an insulating member between a lateral side of the light emitting structure and the connection member.

* * * * *